(12) United States Patent
Maeda et al.

(10) Patent No.: US 8,068,190 B2
(45) Date of Patent: Nov. 29, 2011

(54) DISPLAY DEVICE

(75) Inventors: Kazuhiro Maeda, Osaka (JP); Ichiro Shiraki, Osaka (JP); Hiromi Katoh, Osaka (JP); Kouji Kumada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/061,603

(22) PCT Filed: Jun. 2, 2009

(86) PCT No.: PCT/JP2009/060081
§ 371 (c)(1),
(2), (4) Date: Mar. 1, 2011

(87) PCT Pub. No.: WO2010/026809
PCT Pub. Date: Mar. 11, 2010

(65) Prior Publication Data
US 2011/0164012 A1    Jul. 7, 2011

(30) Foreign Application Priority Data
Sep. 2, 2008   (JP) .................................. 2008-224932

(51) Int. Cl.
*G02F 1/136* (2006.01)
(52) U.S. Cl. ................ 349/49; 349/19; 349/33; 349/41; 349/50
(58) Field of Classification Search .................. 349/19, 349/33, 41, 49, 50
See application file for complete search history.

(56) References Cited

U.S. PATENT DOCUMENTS 6,229,505 B1 * 5/2001 Fujii ............................... 345/76
6,479,940 B1 * 11/2002 Ishizuka .................... 315/169.3
2005/0045881 A1   3/2005 Nakamura et al.
2006/0033016 A1   2/2006 Ogawa et al.
2006/0256093 A1  11/2006 Furukawa et al.
2007/0268206 A1  11/2007 Kinoshita et al.
2009/0312987 A1 * 12/2009 Uedaira et al. ................ 702/189

FOREIGN PATENT DOCUMENTS

| JP | 2006-3857 A | 1/2006 |
| JP | 2006-79589 A | 3/2006 |
| JP | 2006-317682 A | 11/2006 |
| JP | 2007-310628 A | 11/2007 |
| WO | WO 2007/145346 A1 | 12/2007 |
| WO | WO 2007/145347 A1 | 12/2007 |

OTHER PUBLICATIONS

International Search Report dated Sep. 8, 2009 for PCT/JP2009/060081.

* cited by examiner

*Primary Examiner* — Jennifer Doan
(74) *Attorney, Agent, or Firm* — Birch, Stewart, Kolasch & Birch, LLP

(57) ABSTRACT

In a photosensor in the pixel region of an active matrix substrate, the potential of a storage node is read out to output wiring as sensor circuit output, the potential of the storage node having changed in accordance with the amount of light received by a photodetection element in a sensing period, the sensing period being from when a reset signal (RS) is supplied until when a readout signal (RW) is supplied. A sensor startup period whose length is greater than or equal to the length of the sensing period is provided after a sensor data unnecessary period in which the sensor circuit output is not necessary, and furthermore before a valid sensor data period in which the sensor circuit output is necessary, and the sensor circuit output is read out in the valid sensor data period from the photosensor to which the reset signal was applied in the sensor startup period.

4 Claims, 13 Drawing Sheets

DISPLAY DEVICE

TECHNICAL FIELD

The present invention relates to a display device with a photosensor that has a photodetection element such as a photodiode or a phototransistor, and in particular relates to a display device including a photosensor in a pixel region.

BACKGROUND ART

Conventionally, there has been proposed a display device with a photosensor that, due to including a photodetection element such as a photodiode inside a pixel, can detect the brightness of external light and pick up an image of an object that has come close to the display. Such a display device with a photosensor is envisioned to be used as a bidirectional communication display device or display device with a touch panel function.

In a conventional display device with a photosensor, when using a semiconductor process to form known constituent elements such as signal lines, scan lines, TFTs (Thin Film Transistors), and pixel electrodes on an active matrix substrate, photodiodes or the like are formed at the same time on the active matrix substrate (see PTL 1).

FIG. 15 shows an example of a conventional photosensor (PTL 2 and 3) formed on an active matrix substrate. The conventional photosensor shown in FIG. 15 is configured by a photodiode D1, a capacitor C2, and a transistor M2. The anode of the photodiode D1 is connected to wiring for supplying a reset signal RS. The cathode of the photodiode D1 is connected to one of the electrodes of the capacitor C2 and the gate of the transistor M2. The drain of the transistor M2 is connected to wiring for supplying a constant voltage Vsup. Note that sensor circuit output data SData of the photosensor is output from the source of the transistor M2. The other electrode of the capacitor C2 is connected to wiring for supplying a readout signal RW In this configuration, sensor circuit output data SData that is in correspondence with the amount of light received by the photodiode D1 can be obtained by supplying the reset signal RS and the readout signal. RW in accordance with respective predetermined timing. Next is a description of the operation of the conventional photosensor shown in FIG. 15, with reference to FIG. 16. Note that in FIG. 16, the low level (e.g., −4 V) of the reset signal RS is indicated as $-V_b$, and the high level (e.g., 8 V) of the readout signal RW is indicated as $V_{rw}$. It should also be noted that the high level of the reset signal RST is considered to be 0 V, and the low level of the readout signal RW is considered to be 0 V.

A sensing sequence of the photosensor shown in FIG. 15 is described below in three parts, namely (A) readout period, (B) reset period, and (C) sensing period.

(A) Readout period

The readout period corresponds to the period in which the readout signal RW is at the high level. While the readout signal RW is at the high level, the potential $V_{INT}$ of a storage node is "pulled up" via the capacitor C2. Note that the storage node is a connection point between the capacitor C2, the cathode of the photodiode D1, and the gate of the transistor M2. At this time, letting the storage node potential immediately before readout be $V_0$, the capacitance of the capacitor C2 be $C_{st}$, the total in-circuit capacitance be $C_{total}$, and the amplitude of the readout signal RW be $V_{rw}$, the potential $V_{INT}$ of the storage node can be obtained by the below expression.

$$V_{INT} = C_{st}/C_{total} \cdot V_{rw} + V_0$$

Then, due to the "pulled-up" potential $V_{INT}$ exceeding the threshold value of the transistor M2, the transistor M2 is turned on, and the sensor data SData is output. At this time, letting the threshold value of the transistor M2 be $V_{th}$, the current value of a constant current source be I, and the conductance of the transistor M2 be β, the potential $V_{out}$ of SData can be obtained by the below expression.

$$V_{out} \approx V_{INT} - V_{th} - (2I/\beta)^{1/2}$$

(B) Reset period

Due to the reset signal RS switching to the high level (0 V), a forward current flows to the photodiode D1, and the potential $V_{INT}$ of the storage node is reset to 0 V.

(C) Sensing period

The sensing period starts when the reset signal has returned from the high level to the low level. In other words, after the storage node has been reset in the reset period as mentioned above, the reset signal RS switches to the low level $(-V_b)$, and thus the photodiode D1 becomes reverse biased. Then, the storage node changes to the $-V_b$ direction due to a photocurrent that is in accordance with the amount of light that has been incident on the photodiode D1.

The above-described (A) readout period, (B) reset period, and (C) sensing period are considered to be one cycle, and sensor data is read out from the photosensor by repeatedly performing this cycle.

Citation List

Patent Literature

PTL 1: JP 2006-3857A
PTL 2: WO 2007/145346
PTL 3: WO 2007/145347

DISCLOSURE OF INVENTION

Problem to be Solved by the Invention

Depending on the application and operation mode of a display device including a photosensor, there are cases where the photosensor does not need to be driven at all times. In such a case, causing the photosensor to be driven only in periods in which the photosensor is necessary (periods in which a sensor enable signal is on), and to be put in a suspended state or a state in which the operation frequency is lower than during normal operation (intermittent operation state) in periods in which the photosensor is not necessary (periods in which the sensor enable signal is off), as shown in FIG. 17 for example, is preferable due to enabling a reduction in power consumption.

However, as shown in FIG. 17, sensor data obtained immediately after the sensor enable signal has turned on contains invalid data. This is due to the fact that the reset signal RS is not applied to the photosensor in periods in which the sensor enable signal is off. Specifically, after the sensor enable signal has turned on, the sensor data SData that is read out due to the first readout signal RW corresponds to output of the photodiode D1 in a state of not having been reset at the predetermined timing corresponding to the sensing period, and therefore such data cannot be treated as valid data. Accordingly, there is the problem that a time lag occurs between when the sensor enable signal turns on and when valid sensor data is output, thus causing the initial response of an application using the sensor data to be poor.

In light of the above-described problem, an object of the present invention is to provide a display device with a photosensor that can obtain valid data as sensor circuit output data immediately after sensing has restarted after the photosensor had been temporarily put in a suspended state or an intermittent state.

Means for Solving Problem

In order to solve the above-described problem, a display device according to the present invention is a display device including a photosensor in a pixel region of an active matrix substrate, the photosensor including: a photodetection element that receives incident light; a storage node that is connected to the photodetection element, the potential of the storage node changing in accordance with an output current from the photodetection element; reset signal wiring that supplies a reset signal to the photosensor; readout signal wiring that supplies a readout signal to the photosensor; and a sensor switching element for reading out the potential of the storage node to output wiring as sensor circuit output, the potential of the storage node having changed in accordance with the amount of light received by the photodetection element in a sensing period, the sensing period being from when the reset signal is supplied until when the readout signal is supplied, wherein a sensor startup period whose length is greater than or equal to the length of the sensing period is provided after a sensor data unnecessary period in which the sensor circuit output is not necessary, and furthermore before a valid sensor data period in which the sensor circuit output is necessary, and the sensor circuit output is read out in the valid sensor data period from the photosensor to which the reset signal was applied in the sensor startup period.

EFFECTS OF THE INVENTION

According to the present invention, it is possible to provide a display device with a photosensor that can obtain valid data as sensor circuit output data immediately after sensing has restarted after the photosensor had been temporarily put in a suspended state or an intermittent state.

DESCRIPTION OF THE INVENTION

Figure 1:
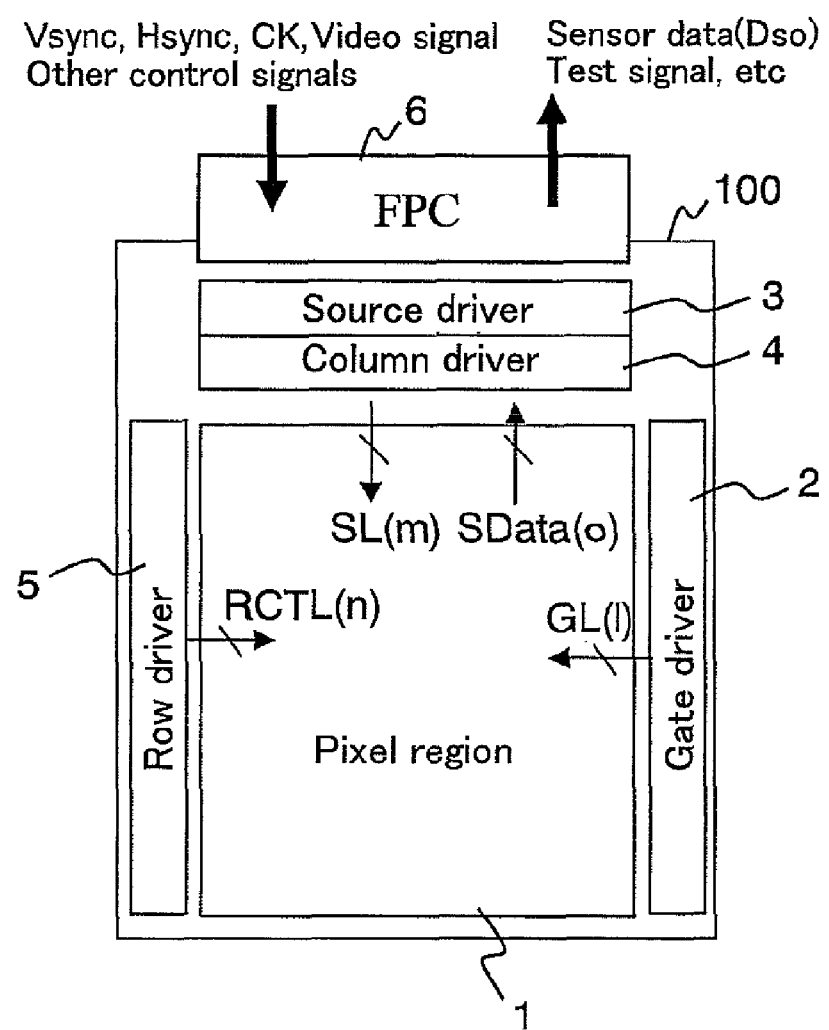
FIG. 1 is a block diagram showing a schematic configuration of a display device according to an embodiment of the present invention.

A display device according to an embodiment of the present invention is a display device including a photosensor in a pixel region of an active matrix substrate, the photosensor including: a photodetection element that receives incident light; a storage node that is connected to the photodetection element, the potential of the storage node changing in accordance with an output current from the photodetection element; reset signal wiring that supplies a reset signal to the photosensor; readout signal wiring that supplies a readout signal to the photosensor; and a sensor switching element for reading out the potential of the storage node to output wiring as sensor circuit output, the potential of the storage node having changed in accordance with the amount of light received by the photodetection element in a sensing period, the sensing period being from when the reset signal is supplied until when the readout signal is supplied, wherein a sensor startup period whose length is greater than or equal to the length of the sensing period is provided after a sensor data unnecessary period in which the sensor circuit output is not necessary, and furthermore before a valid sensor data period in which the sensor circuit output is necessary, and the sensor circuit output is read out in the valid sensor data period from the photosensor to which the reset signal was applied in the sensor startup period.

A feature of the above-described configuration is, in particular, that a sensor startup period whose length is greater than or equal to the length of the sensing period is provided before the valid sensor data period in which sensor circuit output is necessary, and the sensor circuit output obtained from the photosensor to which the reset signal has been applied in the sensor startup period is read out in the valid sensor data period. Accordingly, even the sensor circuit output that is first read out in the valid sensor data period has been obtained from a photodetection element that has been reset at a predetermined timing corresponding to the sensing period, and therefore such sensor circuit output can be used as valid sensor circuit output. This enables providing a display device with a photosensor that can obtain valid data as sensor circuit output data immediately after sensing has restarted after the photosensor had been temporarily put in a suspended state or an intermittent state.

In the above-described display device, it is preferable that the sensor circuit output is not output to the output wiring in the sensor startup period. This enables reducing the amount of power consumed in outputting the sensor circuit output to the output wiring.

In the above-described display device, it is preferable that the sensor startup period and the valid sensor data period immediately thereafter make up one sensing unit period, and the sensing unit period is provided continuously or intermittently in a display operation period. According to this configuration, it is possible to perform a sensor thinning-out operation, thus enabling sensing to be performed in accordance with, for example, the frequency of sensor circuit output that is necessary, and furthermore, providing the sensor startup period before each valid sensor data period enables obtaining valid sensor circuit output from the beginning of all valid sensor data periods.

The above-described display device can be implemented as a liquid crystal display device further including a common substrate opposing the active matrix substrate, and liquid crystal sandwiched between the active matrix substrate and the common substrate.

Below is a description of more specific embodiments of the present invention with reference to the drawings. Note that although the following embodiments show examples of configurations in which a display device according to the present invention is implemented as a liquid crystal display device, the display device according to the present invention is not limited to a liquid crystal display device, and is applicable to an arbitrary display device that uses an active matrix substrate. It should also be noted that due to having a photosensor, the display device according to the present invention is envisioned to be used as, for example, a display device with a touch panel that performs input operations by detecting an object that has come close to the screen, or a bidirectional communication display device that is equipped with a display function and an image capture function.

Also, for the sake of convenience in the description, the drawings that are referenced below show simplifications of, among the constituent members of the embodiments of the present invention, only relevant members that are necessary for describing the present invention. Accordingly, the display device according to the present invention may include arbitrary constituent members that are not shown in the drawings that are referenced in this description. Also, regarding the dimensions of the members in the drawings, the dimensions of the actual constituent members, the ratios of the dimensions of the members, and the like are not shown faithfully.

Embodiment 1

Figure 2:
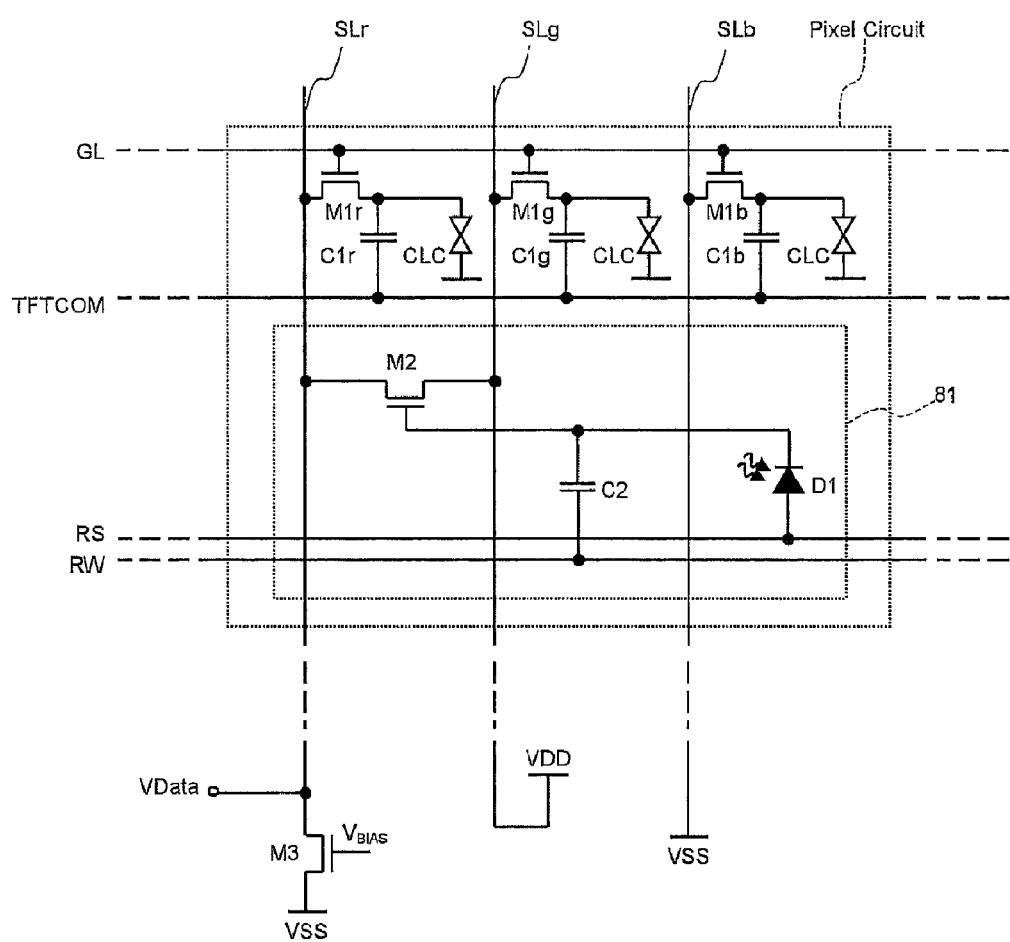
FIG. 2 is an equivalent circuit diagram showing a configuration of a pixel in a display device according to Embodiment 1 of the present invention.

First is a description of a configuration of an active matrix substrate included in a liquid crystal display device according to Embodiment 1 of the present invention with reference to FIGS. 1 and 2.

FIG. 1 is a block diagram showing a schematic configuration of an active matrix substrate 100 included in the liquid crystal display device according to an embodiment of the present invention. As shown in FIG. 1, the active matrix substrate 100 includes at least a pixel region 1, a gate driver 2, a source driver 3, a column driver 4, and a row driver 5 on a glass substrate. Note that although not shown in FIG. 1, a signal processing circuit for processing image signals picked up by a photodetection element (described later) in the pixel region 1 is connected to the active matrix substrate 100 via an FPC 6.

In accordance with synchronization signals (Vsync and Hsync) that have been input from the outside, the gate driver 2 and the source driver 3 perform scanning for writing a video signal, which has been likewise input from the outside, to display pixels in the pixel region 1. On the other hand, the column driver 4 and the row driver 5 are drivers for supplying various types of signals necessary for sensor driving (the later-described readout signal, reset signal, and the like) to photosensors in the pixel region 1, and sequentially outputting sensor circuit output data that has been read out, to the outside of the display device.

Note that the arrangement of the various types of drivers shown in FIG. 1 is merely an example, and how the various types of drivers are mounted is arbitrary design matter. Also, the above-described constituent members on the active matrix substrate 100 can be formed monolithically on the glass substrate by a semiconductor process. Alternatively, a configuration is possible in which an amplifier and the various drivers among the above-described constituent members are mounted on the glass substrate by COG (Chip On Glass) technology or the like. As another alternative, it is conceivable for at least some of the above-described constituent members shown on the active matrix substrate 100 in FIG. 1 to be mounted on the FPC. The active matrix substrate 100 is attached to a common substrate (not shown) that has a common electrode formed on the entire face thereof, and a liquid crystal material is enclosed in the gap therebetween.

The pixel region 1 is a region in which a plurality of pixels are formed in order to display an image. In the present embodiment, a photosensor (sensor circuit 81) for picking up an image is provided in each pixel in the pixel region 1. FIG. 2 is an equivalent circuit diagram showing an arrangement of a pixel and the sensor circuit 81 in the pixel region 1. In the example in FIG. 2, each pixel is formed by three colors of picture elements, namely R (red), G (green), and B (blue), and one sensor circuit 81 configured by a photodiode D1, a capacitor C2, and a thin film transistor M2 is provided in each of the pixels configured by these three picture elements. Specifically, with the configuration of the present embodiment, the pixel region 1 has pixels arranged in a matrix having L rows×M columns, and sensor circuits 81 arranged in a matrix having N rows×O columns. Note that in the present embodiment, the number of gate lines GL in the row direction (L) is equivalent to the number of sensor circuits 81 in the row direction (N), and the number of pixels in the column direction (M) is equivalent to the number of sensor circuits 81 in the column direction (O). The total number of picture elements in the pixel region 1 is equal to L×3M.

As shown in FIG. 2, the pixel region 1 has, as wiring for the pixels, the gate lines GL and source lines SL that are arranged in a matrix. The gate lines GL are connected to the gate driver 2. The source lines SL are connected to the source driver 3. Note that L of the gate lines are provided in the pixel region 1. Hereinafter, the gate lines GL are indicated as GL(1) when there is a need to distinguish between individual gate lines GL in the description. Here, 1 is a natural number from 1 to L.

On the other hand, three of the source lines SL are provided in each pixel in order to supply image data to the three picture elements in each pixel as mentioned above. The source lines SL are indicated as SLr(m), SLg(m), and SLb(m) when there is a need to distinguish between individual source lines SL in the description. Here, m is a natural number from 1 to M.

Thin film transistors (TFTs) M1 are provided as switching elements for the pixels at intersections between the gate lines GL and the source lines SL. Note that in FIG. 2, the thin film transistors M1 provided in the red, green, and blue picture elements are noted as M1r, M1g, and M1b respectively. In each thin film transistor M1, the gate electrode is connected to one of the gate lines GL, the source electrode is connected to one of the source lines SL, and the drain electrode is connected to a pixel electrode that is not shown. Accordingly, as shown in FIG. 2, a liquid crystal capacitor CLC is formed between the drain electrode of each thin film transistor M1 and the common electrode (VCOM). Also, an auxiliary capacitor C1 is formed between each drain electrode and a TFTCOM.

In FIG. 2, the picture element driven by the thin film transistor M1r, which is connected to the intersection between one gate line GL and one source line SLr, is provided with a red color filter so as to correspond to that picture element, and red image data is supplied from the source driver 3 to that picture element via the source line SLr, and thus that picture element functions as a red picture element. Also, the picture element driven by the thin film transistor M1g, which is connected to the intersection between the gate line GL and the source line SLg, is provided with a green color filter so as to correspond to that picture element, and green image data is supplied from the source driver 3 to that picture element via the source line SLg, and thus that picture element functions as a green picture element. Furthermore, the picture element driven by the thin film transistor M1b, which is connected to the intersection between the gate line GLi and the source line SLb, is provided with a blue color filter so as to correspond to that picture element, and blue image data is supplied from the source driver 3 to that picture element via the source line SLb, and thus that picture element functions as a blue picture element.

Note that in the example in FIG. 2, the photosensors are provided in the ratio of one per pixel (three picture elements) in the pixel region 1. However, the disposition ratio of the pixels and photosensors is arbitrary and not limited to merely this example. For example, one photosensor may be disposed per picture element, and a configuration is possible in which one photosensor is disposed for a plurality of pixels.

Figure 3:
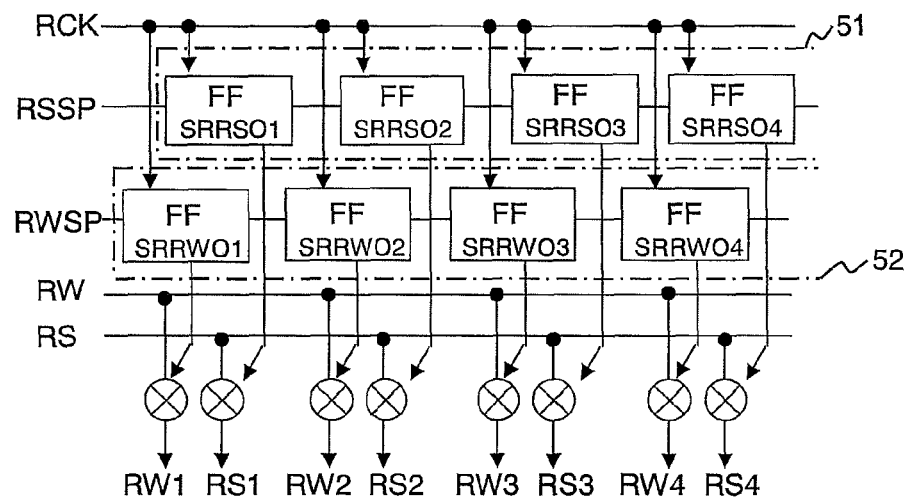
FIG. 3 is an equivalent circuit diagram showing an example of a configuration of a row driver of the display device according to Embodiment 1.
Figure 4:
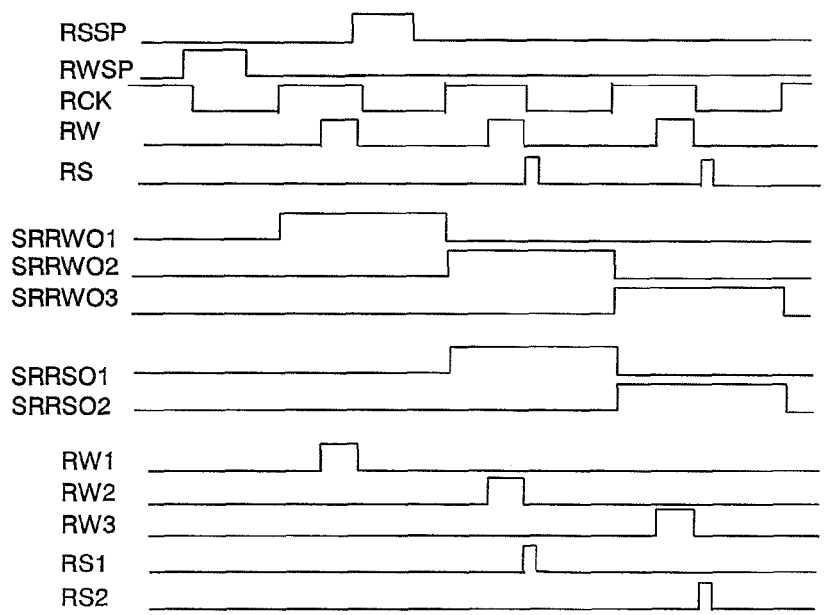
FIG. 4 is a timing chart showing the timing of signals related to the driving of the row driver.

Next is a description of a configuration of the row driver 5 and a method for driving the same with reference to FIGS. 3 and 4. As shown in FIG. 3, the row driver 5 has a shift register 51 composed of N flip-flops that, using RSSP as a start pulse signal, sequentially generate and transfer a signal in synchronization with a clock signal RCK, and a shift register 52 composed of N flip-flops that, using RWSP as a start pulse signal, sequentially generate and transfer a signal in synchronization with the clock signal RCK. With use of its output SRRSOn (n=1 to N), the shift register 51 controls the opening and closing of reset signal analog switches RSn (n=1 to N). With use of its output SRRWOn (n=1 to N), the shift register 52 controls the opening and closing of readout signal analog switches RWn (n=1 to N).

In this way, the reset signal analog switches RSn and the readout signal analog switches RWn are controlled so as to be sequentially opened and closed, and therefore the reset signal RS and the readout signal RW are sequentially supplied to the rows of sensor circuits 81 disposed in the pixel region 1 (see FIG. 4). Note that in the configuration in FIG. 3, the shift register 51 for controlling the reset signal and the shift register 52 for controlling the readout signal are provided independently, thus enabling independently controlling the readout timing and the reset timing by changing the timing of the start pulses RSSP and RWSP respectively.

Figure 5:
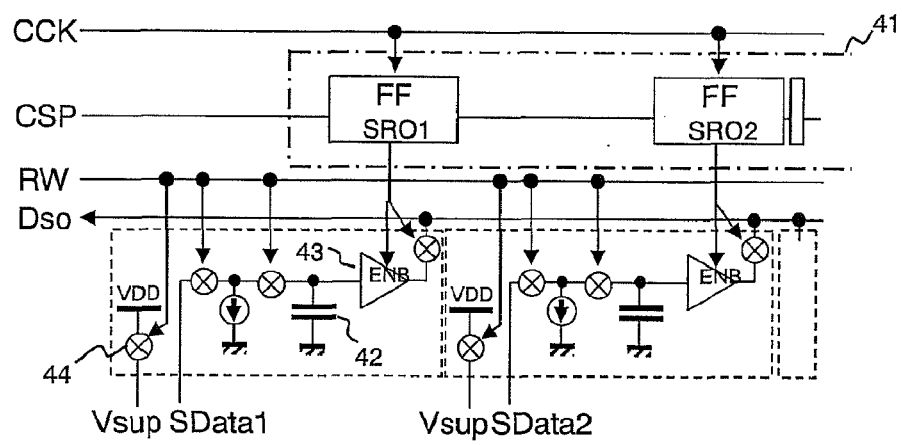
FIG. 5 is an equivalent circuit diagram showing an example of a configuration of a column driver of the display device according to Embodiment 1.
Figure 6:
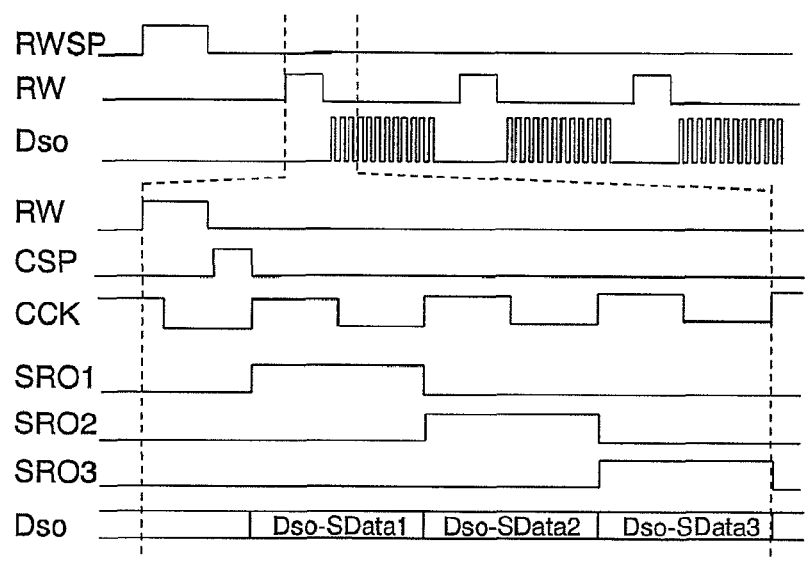
FIG. 6 is a timing chart showing the timing of signals related to the driving of the column driver.

Next is a description of a configuration and operation of the column driver 4 with reference to FIGS. 5 and 6.

As shown in FIG. 5, the column driver 4 has a shift register 41 composed of O flip-flops, holding capacitors 42, output circuits 43, and analog switches 44. With use of CSP as the start pulse, the shift register 41 sequentially generates and transfers a signal in synchronization with a clock signal CCK. The holding capacitors 42 sample sensor circuit output data SDatao (o=1 to O) in accordance with the readout signal RW, and hold the resultant data. The output circuits 43 are enabled by output SROo (o=1 to O) of the shift register 41, and output the data in the holding capacitors 42 to output lines Dso (see FIG. 1). The analog switches 44 are controlled by the readout signal RW, and one of the terminals of each of the analog switches 44 is connected to a power supply line Vsup.

As shown in FIG. 6, according to the configuration in FIG. 5, the sensor circuit output data SDatao for one row is collectively sampled by the holding capacitors 42 and held therein in accordance with the readout signal RW, and thereafter the held data is output to the output lines Dso at respective times in accordance with the sequentially shifted output SROo of the shift register 41. Also, in accordance with the readout signal RW, a constant voltage from power supplies VDD is supplied to the sensor circuits 81 via the power supply lines Vsup to the sensor circuit.

Figure 7:
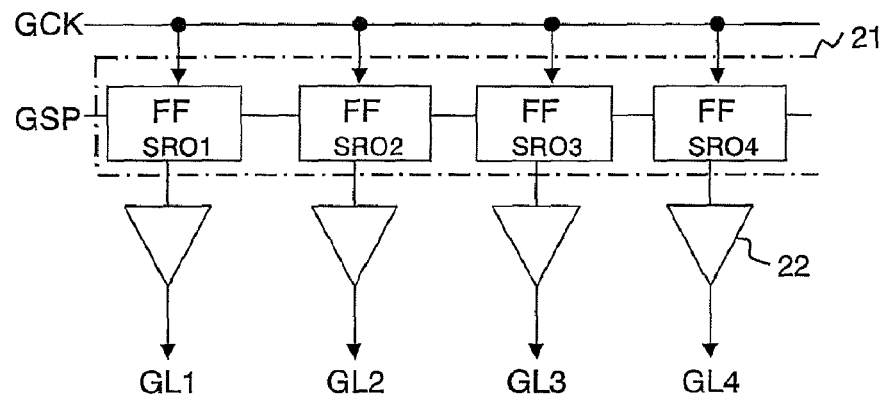
FIG. 7 is an equivalent circuit diagram showing an example of a configuration of a gate driver of the display device according to Embodiment 1.
Figure 8:
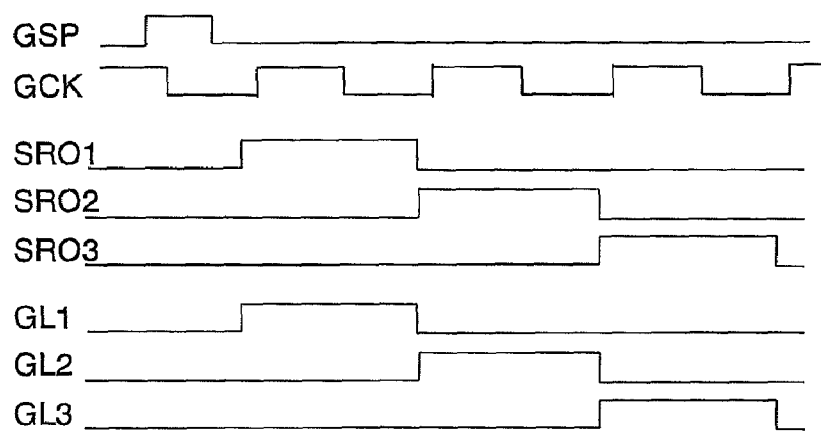
FIG. 8 is a timing chart showing the timing of signals related to the driving of the gate driver.

Next is a description of a configuration and operation of the gate driver 2 with reference to FIGS. 7 and 8. The gate driver 2 has a shift register 21 composed of L flip-flops, and output circuits 22. With use of GSP as the start pulse, the shift register 21 sequentially generates and transfers a signal in synchronization with a clock signal GCK. The output circuits 22 shape and amplify the output signals of output SROl (l=1 to L) of the shift register 21. The output of the output circuits 22 is sequentially output to the gate lines GLl (l=1 to L) in the pixel region 1 as row selection signals.

Figure 9:
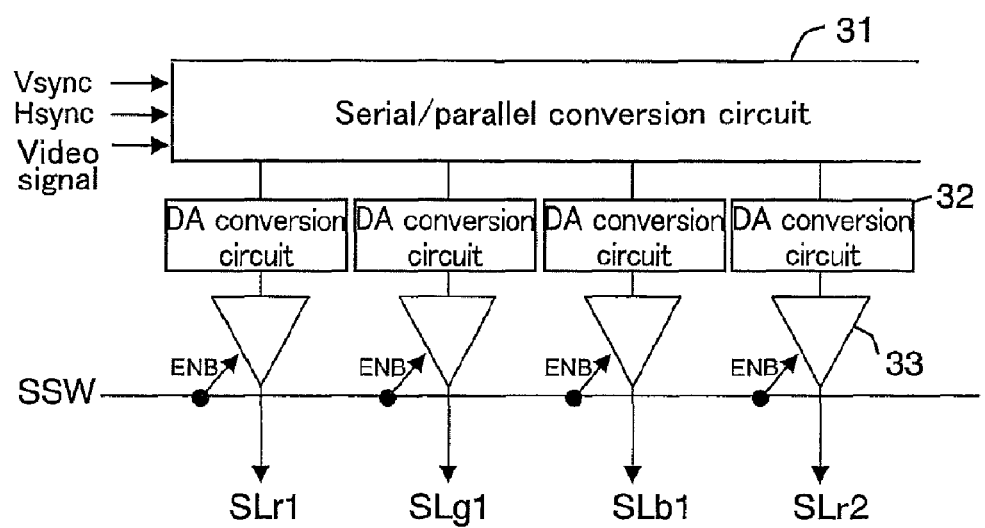
FIG. 9 is an equivalent circuit diagram showing an example of a configuration of a source driver of the display device according to Embodiment 1.
Figure 10:
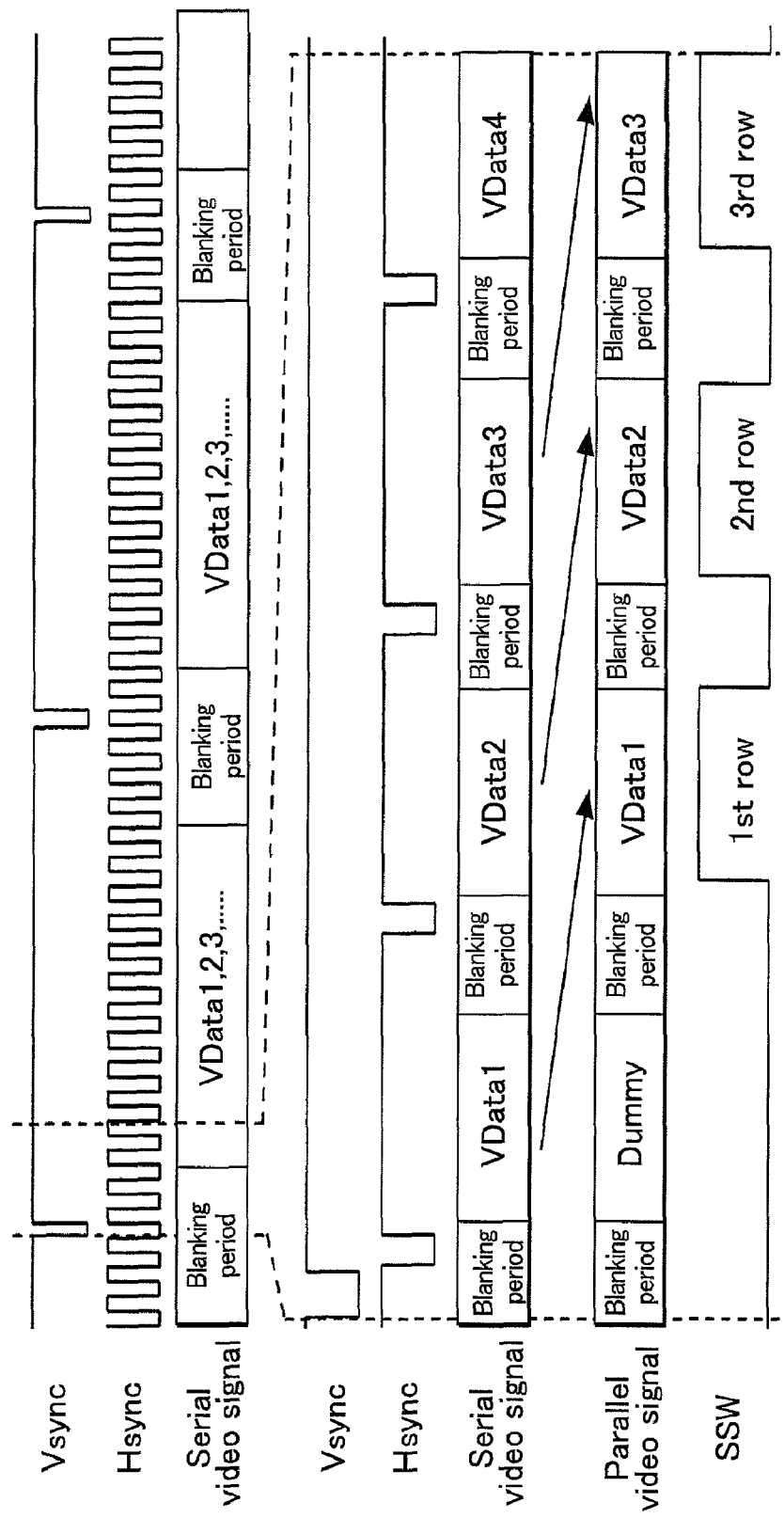
FIG. 10 is a timing chart showing the timing of signals related to the driving of the source driver.

Below is a description of a configuration and operation of the source driver 3 with reference to FIGS. 9 and 10. The source driver 3 has a serial/parallel conversion circuit 31, D/A conversion circuits 32, and amplifiers 33. In synchronization with synchronization signals (Vsync, Hsync, CK, and the like) that have been input from the outside, the serial/parallel conversion circuit 31 converts a serial video signal, which has been likewise input from the outside as digital data, into parallel data. The D/A conversion circuits 32 convert the digital video signal into an analog video signal. In synchronization with SSW, the amplifiers 33 amplify the output of the D/A conversion circuits 32 and output the result to the source lines SLm (m=1 to M).

Figure 11:
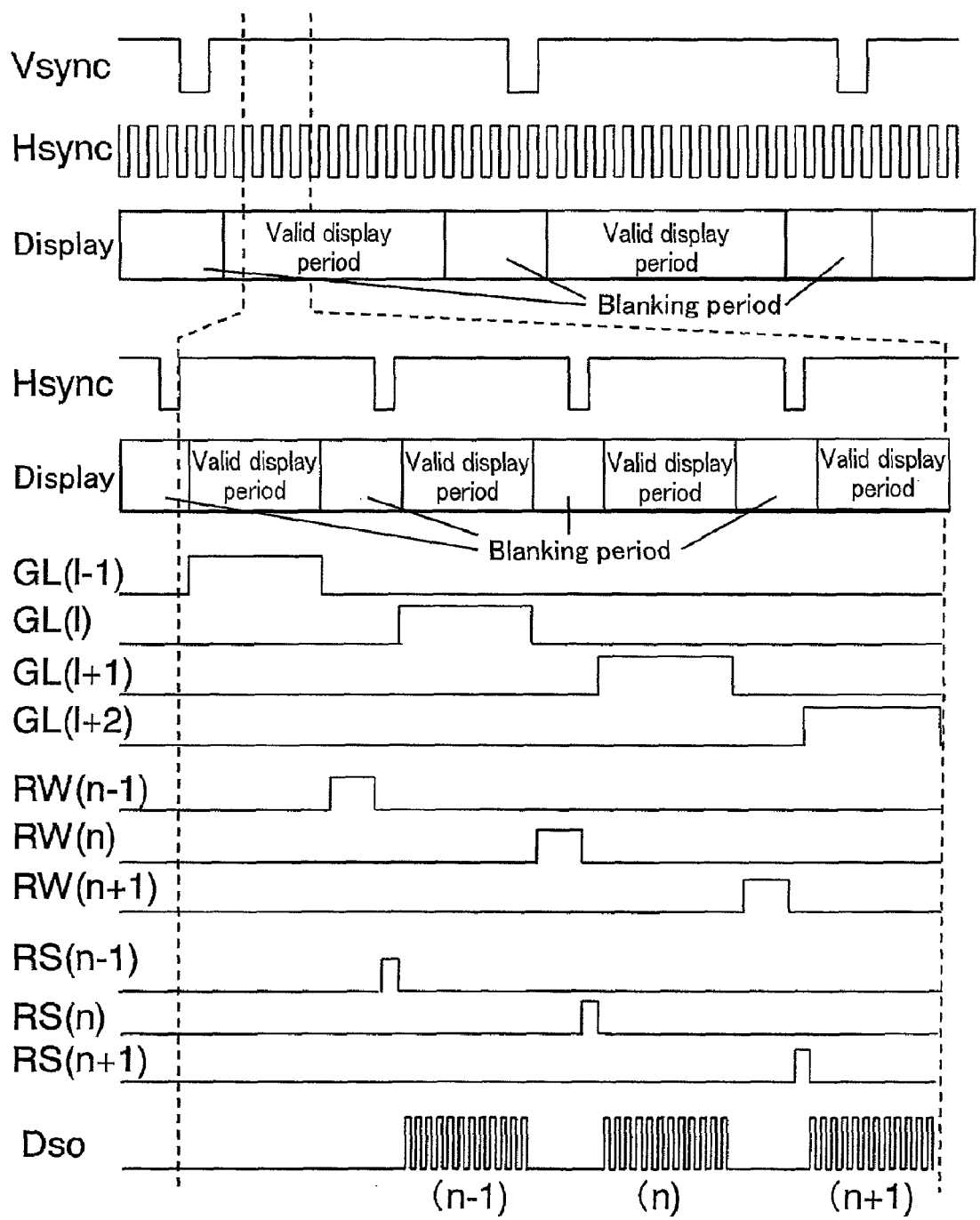
FIG. 11 is a timing chart showing the relationship between display operation timing and sensing timing in the display device according to Embodiment 1.

Next is a description of the timing of display operation of the pixels in the pixel region 1 and the timing of operation of the photosensors with reference to FIG. 11. As shown in FIG. 11, in the present embodiment, in the blanking period of the horizontal scan period, the readout signal RW is turned on, and the sensor circuit output data Dso is read out.

As described above, with the display device according to the present embodiment, the sensor circuit output data Dso is read out from the photosensor according to the aforementioned operation during normal operation, whereas during the suspension of sensor driving, the sensor enable signal is switched to the low level, thus causing both the readout signal RW and the reset signal RS that are supplied to the row driver 5 and the column driver 4 to be maintained at the low level. Accordingly, the sensing sequence of the photosensors, which is reset, then sensing, and then readout, is not executed during the suspension of sensor driving.

Figure 12:
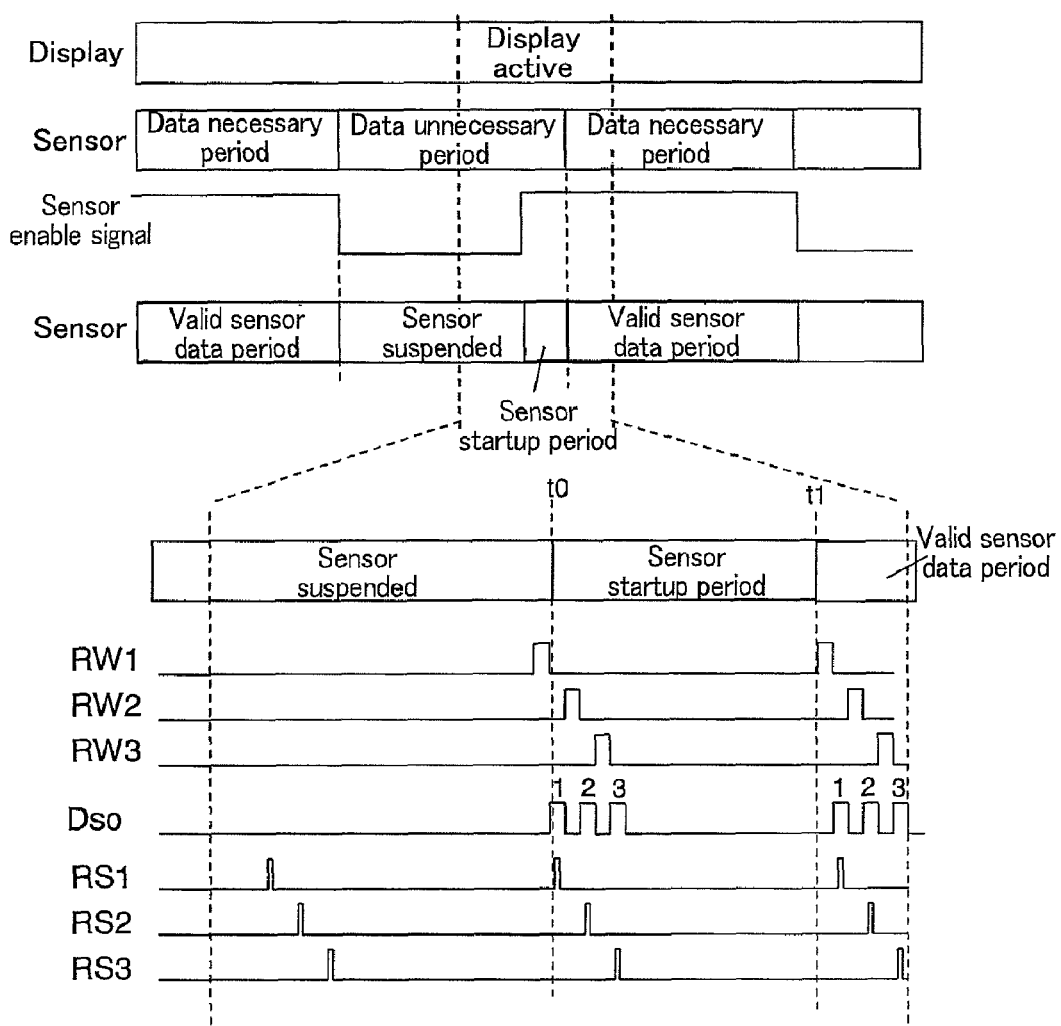
FIG. 12 is a timing chart showing the relationship between a sensor startup period and a valid sensor data period.

Also, a feature of the display device according to the present embodiment is the inclusion of a "sensor startup period" prior to the periods in which sensor data is necessary ("data necessary period" shown in FIG. 12), as shown in FIG. 12. Note that in the display device according to the present embodiment, a data necessary period is a period in which the sensor circuit output data is used as significant data in an application or an operation mode that utilizes photosensor output. In the case of switching from a data unnecessary period to a data necessary period, the sensor startup period is provided immediately before the data necessary period. A sensor startup period comes prior to a sensor necessary period, and is a period in which driving of the photosensors is started prior to the sensor necessary period, such that valid sensor circuit output data is obtained from immediately after the start time of the sensor necessary period. The sensor startup period starts at a time earlier than the first reading timing of the data necessary period by at least the length of the period necessary for sensing during normal operation. Specifically, in the example shown in FIG. 12, the sensor startup period beginning at the start time t0 is provided before the start time t1 of the data necessary period. The start time t0 of the sensor startup period is the time at which a reset signal RS1, which is applied to the photodiode D1 that is read out in accordance with a readout signal RW1, rises. At this start time t0, the sensor enable signal turns on, and thus the sensor startup period starts, the reset signal RS1 is input to the sensor circuit, and the photodiode D1 is reset. Accordingly, the sensor circuit output data Dso that is read out in accordance with the first readout signal RW1 in the data necessary period is valid data, thus enabling sensor circuit output data to be used from the beginning of the data necessary period. Note that the start time of the sensor startup period may be a time before t0.

Figure 13A:
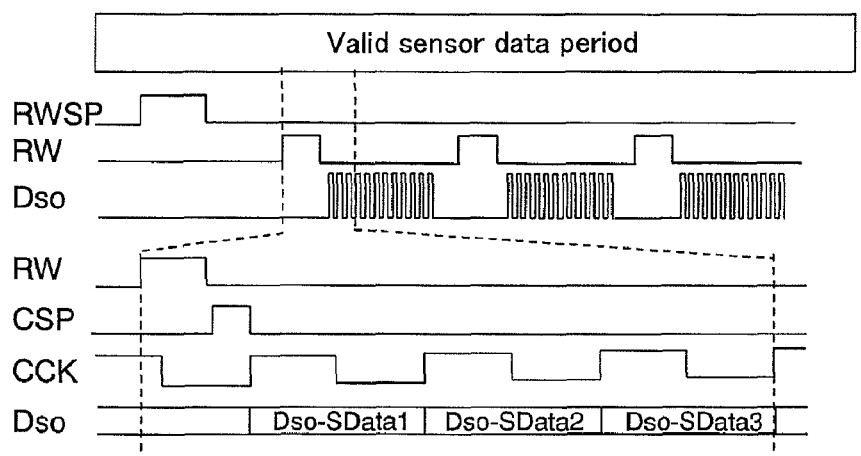
FIGS. 13A and 13B are timing charts respectively showing a condition in which sensor circuit output data is output in only the valid sensor data period, and a condition in which sensor circuit output data is not output in the sensor startup period, as a variation of Embodiment 1.
Figure 13B:
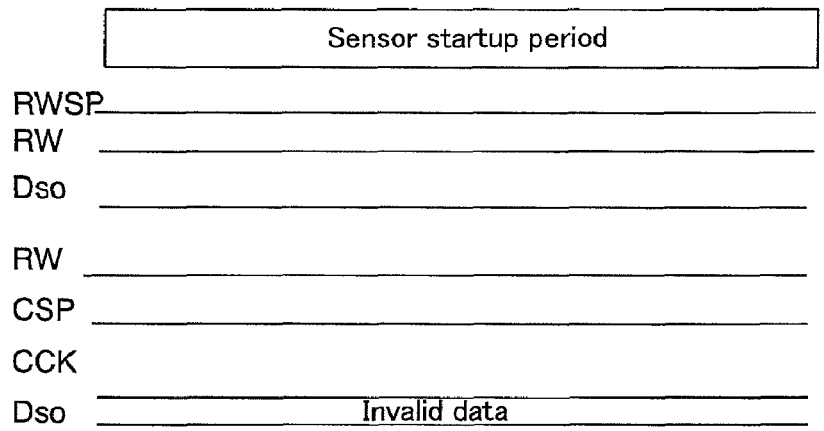

Note that although the sensor circuit output data Dso is output in the sensor startup period as well due to readout signals RW2 and RW3 turning on in the example in FIG. 12, the sensor circuit output data Dso obtained in this sensor startup period is all invalid data. Accordingly, a configuration is possible in which, as shown in FIGS. 13A and 13B, the sensor circuit output data Dso is prevented from being output in the sensor startup period, and is caused to be output in only the valid sensor data period.

In order to realize this, it is sufficient to, for example, prevent the operation of at least either the column driver 4 or the row driver 5. Preventing a driver from operating in this way also has the advantage of enabling power consumption to be reduced. Note that in order to prevent the column driver 4 from operating, it is sufficient to prevent the column start pulse CSP or the clock signal CCK (see FIG. 6) from being input to the column driver 4. Also, in order to prevent the row driver 5 from operating, it is sufficient to prevent the readout start pulse RWSP or the readout signal RW (see FIG. 4) from being input to the row driver 5.

As described above, according to the present embodiment, a sensor startup period for resetting the photodiode D1 and causing sensing to be performed is provided in the process of transitioning from a period in which sensor data is unnecessary to a period in which sensor data is necessary, thus enabling providing a display device with a photosensor having improved response immediately after the sensor enable signal has turned on after the photosensor had been temporarily put in a suspended state or an intermittent state.

Embodiment 2

Below is a description of Embodiment 2 of the present invention. Constituent elements having the same functions as constituent elements described in Embodiment 1 have been given the same reference numerals as those in Embodiment 1, and detailed descriptions thereof have been omitted.

Figure 14:
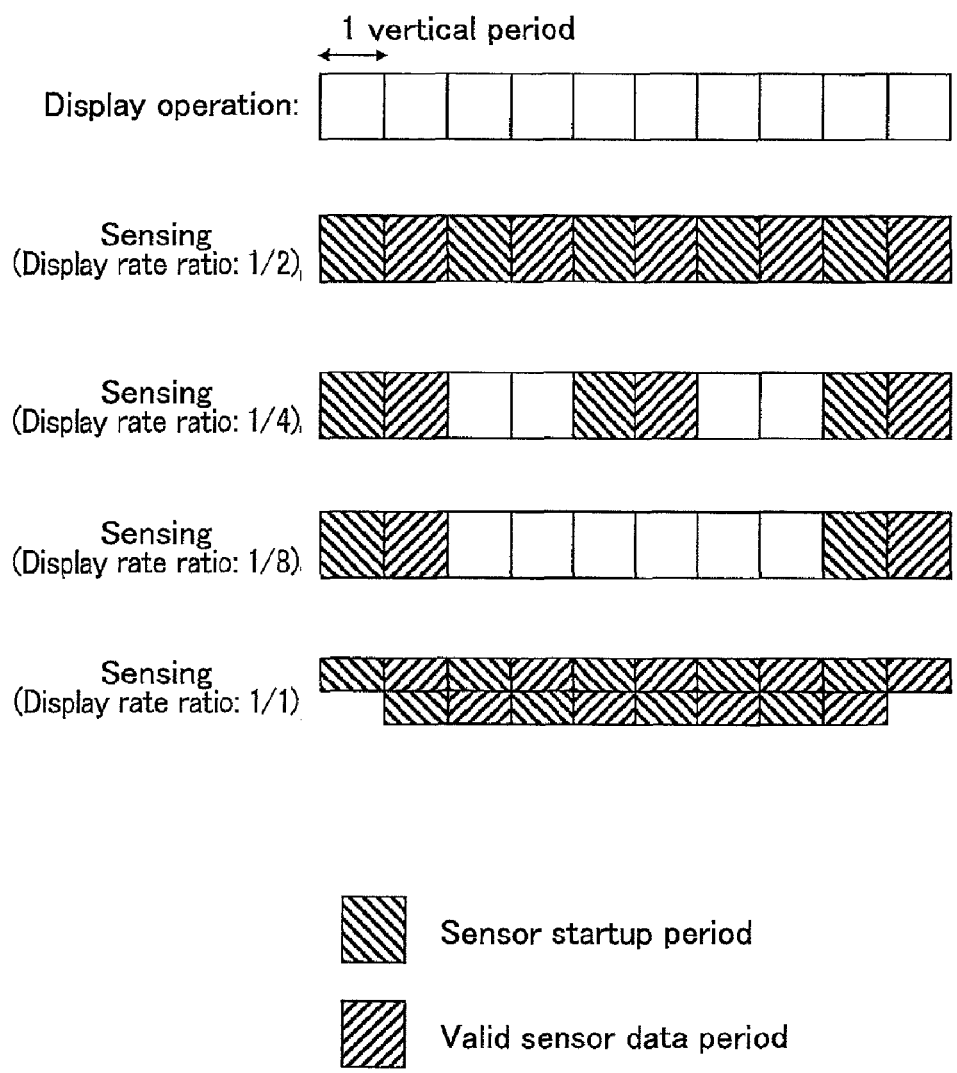
FIG. 14 is a timing chart showing sensor timing in a display device according to Embodiment 2 of the present invention.
Figure 15:
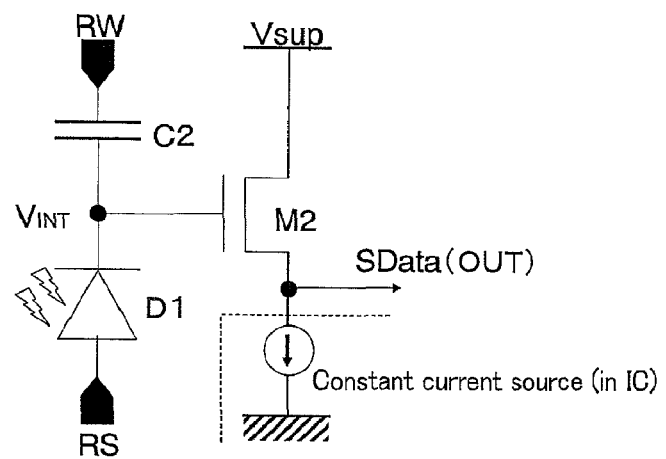
FIG. 15 is an equivalent circuit diagram showing an example of a conventional photosensor formed on an active matrix substrate.
Figure 16:
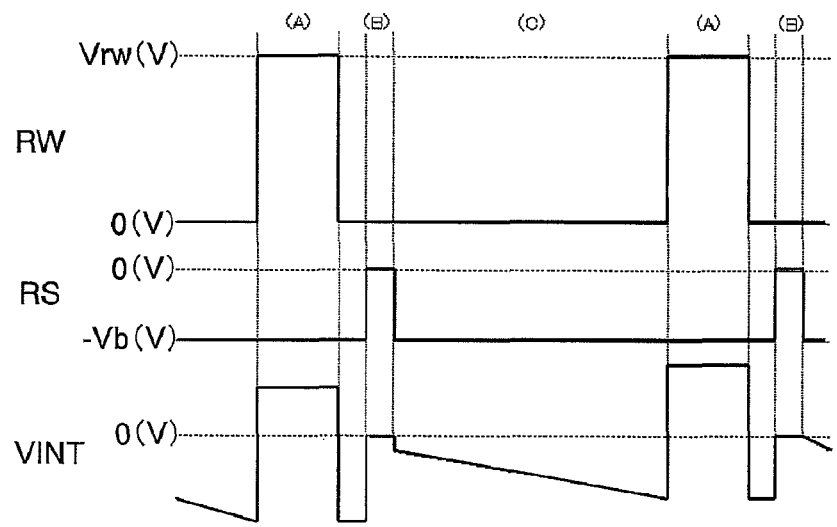
FIG. 16 is a timing chart showing waveforms of driving signals in the conventional photosensor.
Figure 17:
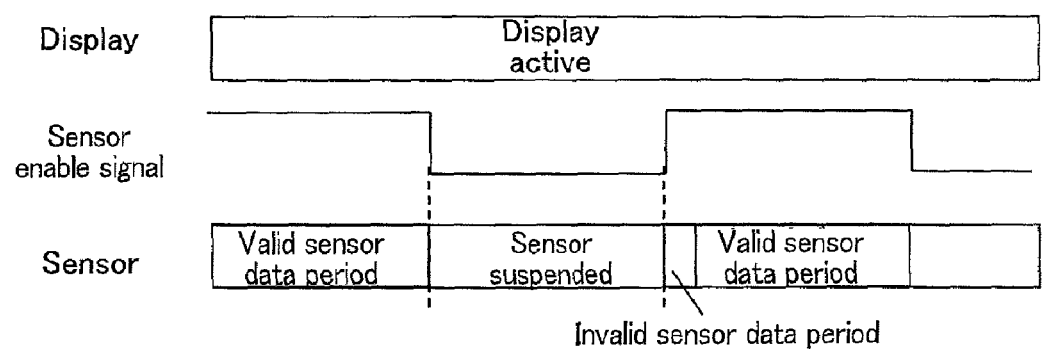
FIG. 17 is a diagram illustratively showing a period in which invalid data is obtained in the case of having a period in which the driving of the photosensor is suspended.

As shown in FIG. 14, in a display device according to Embodiment 2, one valid sensor data period and the sensor startup period provided immediately previous thereto are considered to be one unit period of sensing, and this unit period is provided continuously or intermittently in the display operation period of the panel. For example, in the example in FIG. 14, the valid sensor data period (i.e., the period in which one screen-worth of sensor circuit output data is obtained) is considered to be one vertical period, and the length of the startup period is also considered to be equivalent to one vertical period. In this case, one unit period of sensing corresponds to two vertical periods. By providing this one unit period of sensing in a continuous manner, it is possible to perform sensing at the display rate ratio of 1/2-speed. Also, by providing the one unit period of sensing intermittently at an interval the same length as the one unit period, it is possible to perform sensing at the display rate ratio of 1/4-speed. Furthermore, by providing the one unit period of sensing intermittently at an interval having the length of three unit periods, it is possible to perform sensing at the display rate ratio of 1/8-speed. Also, the startup period in one unit period may overlap with the valid sensor data period of the previous unit period. For example, by causing the startup period to be completely overlapped with the immediately previous valid sensor data period, it is possible to perform sensing at the display rate ratio of 1/1-speed.

In this way, continuously or intermittently providing one unit period of sensing, which is made up of the sensor startup period and the valid sensor data period, enables performing a sensing thinning-out operation. For example, in the case of using the display device of the present embodiment as a display device with a touch panel, it is envisioned that sensing is performed at a high display rate ratio (e.g., the above-described 1/1) when characters are input on the touch panel with use of a touch pen or the like, and sensing is performed at a relatively low display rate ratio (e.g., the above-described 1/8 or 1/4) when receiving a command input by finger touch or the like.

Also, in the case of performing a sensing thinning-out operation as described above, since the display device according to the present embodiment has the sensor startup period before the valid sensor data period, it is possible to treat the sensor circuit output data as valid data from immediately after the start time of the valid sensor data period.

Although Embodiments 1 and 2 of the present invention have been described above, the present invention is not limited to only the above-described embodiments, and various modifications can be made within the scope of the invention.

For example, in the above-described embodiments, the example of a configuration is given in which the wiring VDD, VSS, and OUT that the photosensor is connected to are also used as the source wiring SL. This configuration has the advantage that the pixel aperture ratio is high. However, since the photosensor wiring is also used as the source wiring SL in this configuration, it is impossible to read out the sensor circuit output data while the video signal for image display is being applied to the source wiring SL. For this reason, it is necessary to apply the readout signal for the sensor circuit output data in the blanking period as shown in FIG. 11. In view of this, a configuration is possible in which the photosensor wiring VDD, VSS, and OUT is provided separately from the source wiring SL. This configuration has a lower pixel aperture ratio, but enables the photosensor wiring to be driven independently from the source wiring SL, and therefore has the advantage of enabling the sensor circuit output data to be read out regardless of the pixel display timing.

Also, although the example in which the sensor circuit 81 includes the capacitor C2 as the storage capacitor is given in the above-described embodiments, even if a circuit element corresponding to the storage capacitor is not provided in the sensor circuit 81, it is possible for the parasitic capacitance that is generated at the storage node to be used as the storage capacitor. The capacitor C2 is therefore not essential.

INDUSTRIAL APPLICABILITY

The present invention is industrially applicable as a display device having a photosensor in a pixel region of an active matrix substrate.

REFERENCE SIGNS LIST 1 pixel region
2 gate driver
21 shift register
22 output circuit
3 source driver
31 serial/parallel conversion circuit
32 D/A conversion circuit
33 amplifier
4 column driver
41 shift register
42 holding capacitor
43 output circuit
44 analog switch
5 row driver
51 shift register
52 shift register
6 FPC
100 active matrix substrate

The invention claimed is:

1. A display device comprising a photosensor in a pixel region of an active matrix substrate,
the photosensor comprising:
a photodetection element that receives incident light;
a storage node that is connected to the photodetection element, the potential of the storage node changing in accordance with an output current from the photodetection element;
reset signal wiring that supplies a reset signal to the photosensor;
readout signal wiring that supplies a readout signal to the photosensor; and
a sensor switching element for reading out the potential of the storage node to output wiring as sensor circuit output, the potential of the storage node having changed in accordance with the amount of light received by the photodetection element in a sensing period, the sensing period being from when the reset signal is supplied until when the readout signal is supplied,
wherein a sensor startup period whose length is greater than or equal to the length of the sensing period is provided after a sensor data unnecessary period in which the sensor circuit output is not necessary, and furthermore before a valid sensor data period in which the sensor circuit output is necessary, and the sensor circuit output is read out in the valid sensor data period from the photosensor to which the reset signal was applied in the sensor startup period.

2. The display device according to claim 1, wherein the sensor circuit output is not output to the output wiring in the sensor startup period.

3. The display device according to claim 1,
wherein the sensor startup period and the valid sensor data period immediately thereafter make up one sensing unit period, and
the sensing unit period is provided continuously or intermittently in a display operation period.

4. The display device according to claim 1, further comprising:
a common substrate opposing the active matrix substrate; and
liquid crystal sandwiched between the active matrix substrate and the common substrate.

* * * * *